United States Patent
Kobayashi et al.

(10) Patent No.: US 9,093,497 B2
(45) Date of Patent: Jul. 28, 2015

(54) METHOD FOR MANUFACTURING BONDED SOI WAFER

(71) Applicant: SHIN-ETSU HANDOTAI CO., LTD., Tokyo (JP)

(72) Inventors: Norihiro Kobayashi, Takasaki (JP); Toru Ishizuka, Takasaki (JP); Hiroji Aga, Takasaki (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 14/371,048

(22) PCT Filed: Dec. 26, 2012

(86) PCT No.: PCT/JP2012/008300
§ 371 (c)(1),
(2) Date: Jul. 8, 2014

(87) PCT Pub. No.: WO2013/111242
PCT Pub. Date: Aug. 1, 2013

(65) Prior Publication Data
US 2015/0017783 A1    Jan. 15, 2015

(30) Foreign Application Priority Data
Jan. 24, 2012  (JP) ................................. 2012-012256

(51) Int. Cl.
*H01L 21/762* (2006.01)
*H01L 21/225* (2006.01)
(Continued)

(52) U.S. Cl.
CPC ...... *H01L 21/76254* (2013.01); *H01L 21/2253* (2013.01); *H01L 21/2255* (2013.01); *H01L 21/31111* (2013.01); *H01L 21/3247* (2013.01)

(58) Field of Classification Search
USPC .......................................................... 438/458
See application file for complete search history.

(56) References Cited

U.S. PATENT DOCUMENTS

| 6,372,609 | B1 | 4/2002 | Aga et al. |
| 2003/0181001 | A1 | 9/2003 | Aga et al. |
| 2010/0120223 | A1 | 5/2010 | Kobayashi et al. |

FOREIGN PATENT DOCUMENTS

| JP | A-05-211128 | 8/1993 |
| JP | A-11-307472 | 11/1999 |

(Continued)

OTHER PUBLICATIONS

Sep. 24, 2014 Office Action issued in Japanese Application No. 2012-012256 (with partial translation).
(Continued)

*Primary Examiner* — Alexander Ghyka
(74) *Attorney, Agent, or Firm* — Oliff PLC

(57) ABSTRACT

The present invention is directed to a method for manufacturing an SOI wafer in which the bonded SOI wafer after the delamination by the ion implantation delamination method is subjected to a rapid thermal oxidation process such that an oxide film is formed on a surface of the SOI layer, the oxide film is removed, the bonded SOI wafer is then subjected to a flattening heat treatment to flatten the surface of the SOI layer, the flattening heat treatment causing migration of silicon atoms of the surface of the SOI layer, and the bonded SOI wafer is then subjected to a sacrificial oxidation process to adjust a film thickness of the SOI layer. The method enables efficient manufacture of a high quality SOI wafer having an SOI layer with sufficiently reduced surface roughness of the SOI layer surface and fewer deep pits in the SOI layer surface.

16 Claims, 3 Drawing Sheets

(51) Int. Cl.
*H01L 21/311* (2006.01)
*H01L 21/324* (2006.01)

(56) References Cited

FOREIGN PATENT DOCUMENTS

| JP | A-2000-124092 | 4/2000 |
|---|---|---|
| JP | A-2004-281805 | 10/2004 |
| JP | A-2008-526010 | 7/2008 |
| JP | A-2008-262992 | 10/2008 |
| JP | A-2009-032972 | 2/2009 |
| WO | WO 03/009386 A1 | 1/2003 |
| WO | WO 2006/070220 A1 | 7/2006 |
| WO | WO 2009/016795 A1 | 2/2009 |

OTHER PUBLICATIONS

Mar. 19, 2013 International Search Report issued in International Application No. PCT/JP2012/008300.

Jul. 29, 2014 English-language version of International Preliminary Report on Patentability issued in International Application No. PCT/JP2012/008300.

METHOD FOR MANUFACTURING BONDED SOI WAFER

TECHNICAL FIELD

The present invention relates to a method for manufacturing a bonded SOI wafer by an ion implantation delamination method, and more particularly to a method for manufacturing a bonded SOI wafer by bonding a silicon single crystal wafer into which ions such as hydrogen ions are implanted to a base wafer, i.e., a support substrate, and a portion of the silicon single crystal wafer is then delaminated.

BACKGROUND ART

An ion implantation delamination method (also referred to as the Smart Cut method (registered trademark)), involving bonding a bond wafer into which. ions are implanted and delaminating a portion of the bond wafer, is one of methods that has recently begun to receive attention for manufacturing a bonded SOT wafer. The ion implantation delamination method is an art (See Patent Document 1) to form a bonded wafer having a thin film (an SOI layer) over a base wafer in the following manner: An oxide film is formed on at least one of two wafers, and gas ions, such as hydrogen ions and rare gas ions, are implanted from a front surface of: one of the wafers (the bond wafer) to form a micro bubble layer (an sealed layer) in the interior of the wafer. The surface from which the ions are implanted is then brought into close contact with the other wafer (a base wafer) through the oxide film (an insulator film), and a heat treatment (a delamination heat treatment) is then performed to cleave one of the wafers (the bond wafer) along the micro bubble layer so that the bond wafer is delaminated into a thin film. A heat treatment (a bonding heat treatment) is then performed to strengthen a bond between the wafers. This method makes the cleaved surface (the delamination surface) a good mirror surface, readily manufacturing an SOI wafer having a thin film, particularly an SOI layer, with relatively high thickness uniformity.

However, in case of fabricating a bonded SOI wafer based on the ion, implantation delamination method, a damaged layer formed due to the ion implantation is present on a surface of the bonded wafer after the delamination, and surface roughness is considerable as compared with a mirror surface of a regular product level silicon wafer. Therefore, according to the ion implantation delamination method, it is necessary to remove such a damaged layer and to reduce the surface roughness.

Conventionally, mirror polishing with extremely small polishing stock removal (a stock removal of about 100 nm), referred to as touch polishing, is performed to remove the damaged layer, and others, in the final step after the bonding heat treatment.

However, when polishing including a machining element is performed with respect to the SOI layer, since the stock removal, of the polishing is not uniform, there occurs a problem that film thickness uniformity of the SOI layer achieved by implantation of hydrogen ions and delamination and others is deteriorated.

For the purpose of solving such a problem, a flattening process involving heat treatment at a high temperature has been employed to improve the surface roughness instead of the touch polishing.

For example, Patent Document 2 suggests adding a heat treatment (a rapid heating/rapid cooling heat treatment (an RTA treatment)) in a reducing atmosphere containing hydrogen without polishing a surface of an SOI layer after a delamination heat treatment (or a bonding heat treatment). Further, Patent Document 3suggests forming an oxide film on an SOI layer by a heat treatment in an oxidizing atmosphere after the delamination heat treatment (or the bonding heat treatment), then removing the oxide film, and subsequently adding a heat treatment (the rapid heating/rapid cooling heat treatment (the RTA treatment)) in a reducing atmosphere.

Furthermore, in Patent Document 4, a sacrificial oxidation treatment is performed with respect to a delaminated SOI wafer after a flattening heat treatment in an inert gas, a hydrogen gas, or a mixed gas atmosphere containing these gases, whereby flattening of a delamination surface and avoidance of OSFs can be achieved at the same time.

As described above, since the high-temperature heat treatment is carried out in place of the touch. polishing and the flattening treatment for improving the surface roughness is effected, SOI wafers each having a diameter of 300 mm and excellent film thickness uniformity that a film thickness Range (a value obtained by subtracting a minimum value from a maximum value in a radial direction) of each SOI layer is within 3 nm can be obtained in a high-volume production level by the ion implantation delamination method.

Patent Document 5 discloses a method involving performing the PTA process under a reducing atmosphere containing hydrogen (hereinafter, also referred to as the hydrogen RTA process), disclosed in Patent Document 2, and the sacrificial oxidation process before the flattening heat treatment (a heat treatment under a non-oxidizing atmosphere), disclosed in Patent Document 4, to improve the surface roughness and to suppress the generation of recessed defects.

CITATION LIST

Patent Literature

Patent Document 1: Japanese Unexamined Patent publication (Kokai) No. H05-211128
Patent Document 2: Japanese Unexamined Patent publication (Kokai) No. H11-307472
Patent Document 3: Japanese Unexamined Patent publication (Kokai) No. 2000-124092
Patent Document 4: International Publication WO2003009386
Patent Document 5: Japanese Unexamined Patent publication (Kokai) No. 2009-32972

SUMMARY OF INVENTION

Problem to be Solved by the Invention

As disclosed in Patent Document 5, the RTA process under an atmosphere containing hydrogen, which provides a stronger migration effect, performed before the flattening heat treatment (a heat treatment in a batch furnace), such as argon annealing is effective for efficient flattening of the SOI layer surface after the delamination. In the case of performing the hydrogen RTA process after the delamination, the argon annealing performed without the sacrificial oxidation process right after the hydrogen RTA process causes deep pits in the SOI layer surface, deteriorating the surface roughness of the SOI layer.

The argon annealing accordingly needs to be performed. after the sacrificial oxidation process performed after the hydrogen RTA process to avoid the deterioration. Thus, completion of an SOI wafer, i.e., final products, disadvantageously requires complicated processes including an additional sacrificial oxidation. process for adjusting the film thickness of the SOI layer after the argon annealing (delamination→hydrogen RTA process→sacrificial oxidation process→argon annealing→sacrificial oxidation process).

The present invention was accomplished in view of the above-described problems. It is an object of the present invention to efficiently manufacture a high quality SOI wafer having an SOI layer with sufficiently reduced surface roughness of the SOI layer surface and fewer deep pits in the SOI layer surface.

Means for Solving Problem

To solve the problems, the present invention provides a method for manufacturing a bonded SOI wafer, comprising: implanting at least one gas ion selected. from a hydrogen ion and a rare gas ion from a surface of a bond wafer to form an ion-implanted layer in an interior of the bond wafer, the bond wafer being composed of silicon single crystal; bonding the ion-implanted surface of the bond wafer to a surface of a base wafer through an insulator film; and delaminating a portion of the bond wafer along the ion-implanted layer to form a bonded SOI wafer having an SOI layer over the base wafer, the SOI layer being composed of a thin film of the bond wafer, wherein the bonded SOI wafer after the delamination is subjected to a rapid thermal oxidation process such that an oxide film is formed on a surface of the SOI layer, the oxide film is removed, the bonded SOI wafer is then subjected to a flattening heat treatment to flatten the surface of the SOI layer, the flattening heat treatment causing migration of silicon atoms of the surface of the SOI layer, and the bonded SOI wafer is then subjected to a sacrificial oxidation process to adjust a film thickness of the SOI layer.

The present invention also provides a method for manufacturing a bonded SOI wafer, comprising: implanting at least one gas ion selected from a hydrogen ion and a rare gas ion from a surface of a bond wafer to form an ion-implanted layer in an interior of the bond wafer, the bond wafer being composed of silicon single crystal; bonding the ion-implanted surface of the bond wafer to a surface of a base wafer through an insulator film; and delaminating a portion of the bond wafer along ion-implanted layer to form a bonded SOI wafer having an SOI layer over the base wafer, the SOI layer being composed of a thin film of the bond wafer, wherein the bonded SOI wafer after the delamination is subjected to a rand thermal oxidation process such that an oxide film is formed on a surface of the SOI layer, the bonded SOI wafer is then subjected to a sacrificial oxidation process to adjust a film thickness of the SOI layer after removing the oxide film or without removing the oxide film, and the bonded SOI wafer is then subjected to a flattening heat treatment to flatten the surface of the SOI layer, the flattening heat treatment causing migration of silicon atoms of the surface of the SOI layer.

In this method, the bonded SOI wafer is preferably subjected to an additional sacrificial oxidation process to adjust the film thickness of the SOI layer after the flattening heat treatment.

Such methods for manufacturing a bonded SOI wafer enable efficient manufacture of a high quality SOI wafer having an SOI layer with sufficiently reduced surface roughness of the SOI layer surface and fewer deep pits in the SOI layer surface. The latter method for manufacturing an bonded SOI wafer includes the sacrificial oxidation process (thermal oxidation and removal of a thermal oxide film), for adjusting the film thickness of the SOI layer, performed before the flattening heat treatment, thereby finishing the SOI wafer as a product by the flattening heat treatment. The latter method may include the additional sacrificial oxidation process after the flattening heat treatment to make fine adjustment to the SOI film thickness.

In the methods, the rapid thermal oxidation process preferably forms the oxide film with a film thickness of 5 nm or more on the surface of the SOI layer.

The rapid thermal oxidation process forming the oxide film with a film thickness of 5 nm or more allows the depth of the pits to be further reduced.

In the methods, the rapid thermal oxidation process is preferably performed at 1100° C. or more for 10 seconds or more.

The rapid thermal oxidation process performed under such heat treatment conditions allows the surface roughness of the SOI layer surface to be further reduced.

In the methods, the flattening heat treatment is preferably performed under a hydrogen gas, an inert, gas, or a mixed gas thereof, and the flattening heat treatment is preferably performed in a rapid thermal annealing furnace, or a resistance heating furnace for heat treatment.

The flattening heat treatment, which causes migration of silicon atoms of the surface of the SOI layer, is preferably, but not limited to, argon annealing in the resistance heating furnace for heat treatment, or a rapid thermal annealing under a hydrogen atmosphere or an atmosphere of a mixed gas of argon and hydrogen in the rapid thermal annealing furnace.

Effect of Invention

As described above, the method for manufacturing a bonded SOI wafer of the present invention enables efficient, manufacture of a high quality SOI wafer having an SOI layer with sufficiently reduced surface roughness of the SOI layer surface and fewer deep pits in the SOI layer surface.

DESCRIPTION OF EMBODIMENTS

Figure 1:
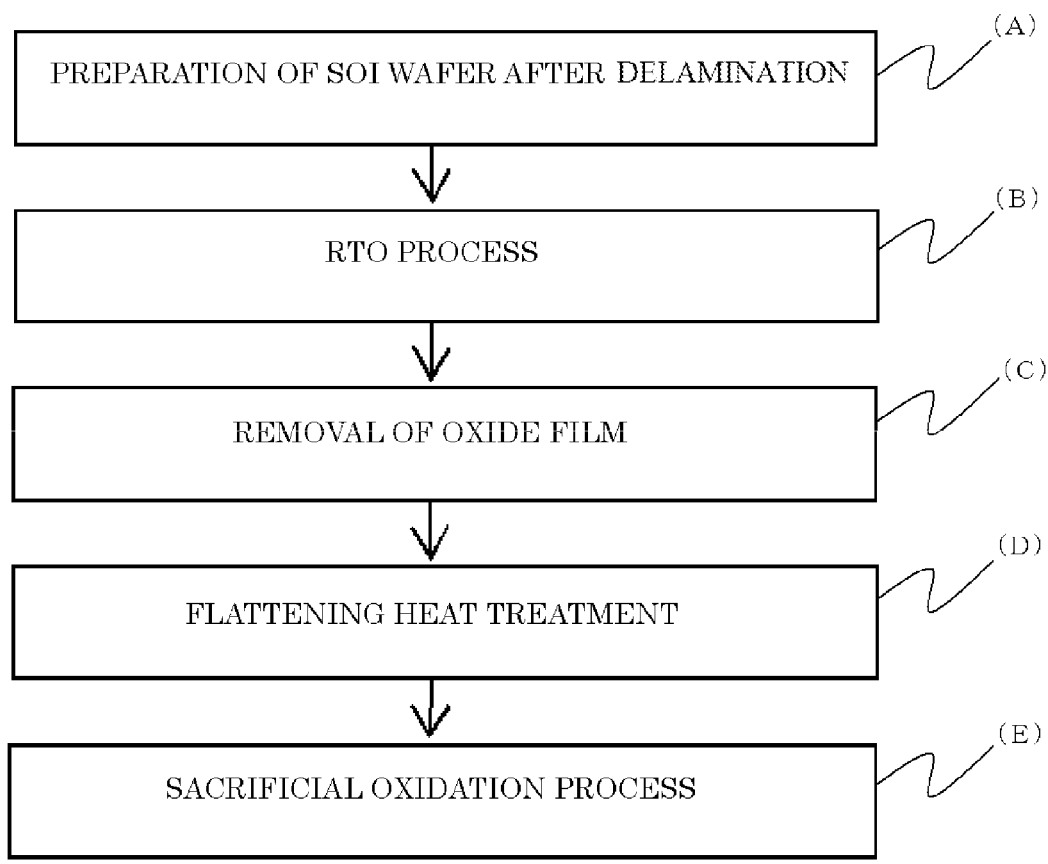
FIG. 1 illustrates a flowchart of an example of the method for manufacturing a bonded SOI wafer of the present invention.

As described above, there exists a need for a method for efficiently manufacturing a high quality SOI wafer having an SOI layer with sufficiently reduced surface roughness of the SOI layer surface and fewer deep pits in the SOI layer surface.

The present inventors studied the heat treatment for flattening the delamination surface and, particularly in view of efficiency in SOI wafer manufacture, the heat treatment under an argon atmosphere in a batch furnace (the argon annealing), in which a set of wafers can be processed together. The study revealed that the argon annealing needs to be performed at a heat treatment condition of a high temperature for a long time to sufficiently flatten the SOI surface due to the migration, and such argon annealing causes a problem in that a frequency of generation of slip dislocations increases. The inventor accordingly conceived that the RTA process under an atmosphere containing hydrogen (the hydrogen RTA), which provides a stronger migration effect, is performed before the argon annealing to reduce the function of the argon annealing.

However, the inventors found that the argon annealing performed right after the hydrogen RTA process generates pits (having a diameter of 0.5 to several ten microns and a depth of several nanometers), which can be measured within an area of 30 square microns by an atom force microscope (AFM), on the SOI layer surface, resulting in worse surface roughness. The inventors also found that such a pit may be generated in the case of performing the argon annealing on the SOI layer surface (the delamination surface) without the hydrogen RTA process. In contrast, no pit is generated when the hydrogen RTA process followed by the argon annealing is performed on a normal PW (mirror-polished wafer). It can therefore be understood that the generation of such a pit is peculiar to a surface having large surface roughness, such as the delamination surface of the SOI layer after the ion implantation delamination.

The inventors also found that the argon annealing after the sacrificial oxidation process performed right after the hydrogen RTA process enables the depth of the pits to be reduced and the surface roughness to be improved. There is however a concern about reduction in production by the method involving the sacrificial oxidation process between the hydrogen RTA process and the argon annealing, because the completion of an SOI wafer, a final product, needs complicated processes of the delamination→the hydrogen PTA process→the sacrificial oxidation process→the argon annealing→the sacrificial oxidation process for adjusting the SOI film thickness (the same processes as those disclosed in Patent Document 5).

The inventors accordingly considered that an RTA process (a rapidly heating and rapidly cooling process) under an oxidizing atmosphere, i.e., a rapid thermal oxidation process (RTO), can be employed instead of the steps of hydrogen RTA process right after the delamination and the sacrificial oxidation process, and diligently studied the process, thereby bringing the present invention to completion.

FIG. 1 illustrates a flowchart of an example of the method for manufacturing a bonded SOI wafer of the present invention.

First an SOI wafer after delamination is prepared by the ion implantation delamination method (FIG. 1 at (A)). More specifically, an SOI wafer after delamination is formed by the procedure illustrated in FIG. 3.

Figure 3:
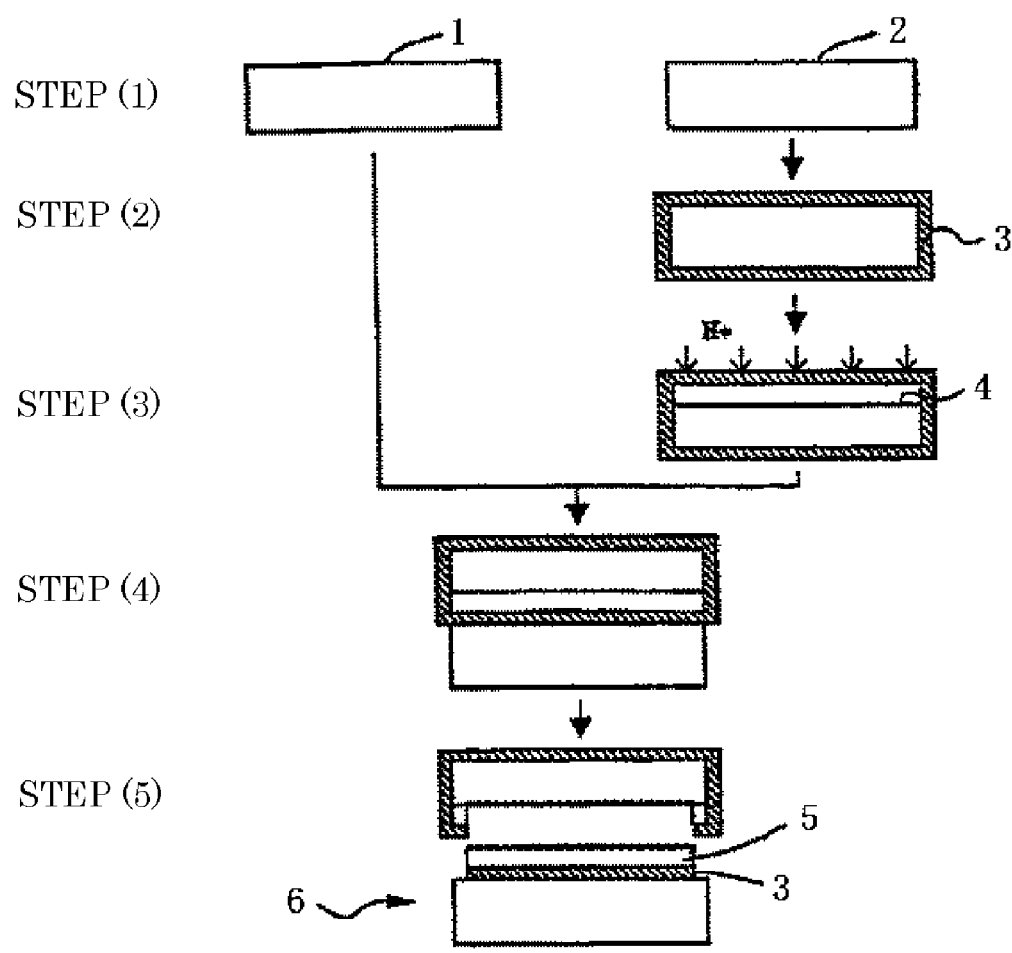
FIG. 3 illustrates a flowchart of exemplary procedures of manufacturing an SOI wafer by the ion implantation delamination method.

The ion implantation delamination, method illustrated in FIG. 3 includes the step (1) of preparing a base wafer 1, which is a support substrate, and a bond wafer 2, composed of silicon single crystal, for an SOI layer according to device's specifications. The base wafer 1 may be, but not limited to, a silicon single crystal wafer.

In the step (2), an insulator film 3 is then formed on the surface of at least one of the bond wafer 2 and the base wafer 1 (in the case of FIG. 3, on the surface of the bond wafer 2). The insulator film 3 may be an oxide film having a thickness of about 10 to 2000 nm, for example.

In the step (3), at least one gas ion selected from a hydrogen ion and a rare gas ion are implanted into the bond wafer 2, on which the insulator film 3 has been formed, from one surface of the bond wafer to form an ion-implanted layer 4 in the interior of the bond wafer 2. The term "hydrogen ions" in the present invention includes hydrogen molecule ions.

In the step (4) the base wafer 1 is bonded to the ion-implanted surface of the bond wafer 2 through the insulator film 3. The wafers are normally bonded together without an adhesive by bringing the surface of the base wafer 1 into contact with the surface of the bond wafer 2 under a clean atmosphere at room temperature.

In the step (5), a portion of the bond wafer 2 is delaminated along the ion-implanted layer to form a bonded SOI wafer 6 having an SOI layer 5, composed of a thin film of the bond wafer, over the base wafer. The bond wafer can be delaminated along the ion-implanted layer by a heat treatment at temperatures of about 500° C. or more under an inert gas atmosphere, for example. The bond wafer can instead be delaminated by applying external force, without the heat treatment for after performing a heat treatment that does not cause the bond wafer to be delaminated), provided that the bonding surfaces at room temperature are subjected to a plasma treatment in advance to solidify the bond of the bonding interface.

Next, the bonded SDI wafer after delamination obtained in the above manner is subjected to the RTA process (a rapidly heating and rapidly cooling process) under an oxidizing atmosphere, that is, the RTO process (FIG. 1 at (B)). The RTO process is preferably performed at temperatures of 1100° C. or more for 10 seconds or more (particularly not less than 10 seconds and not more than 300 seconds).

The RTO process at temperatures of 1100° C. or more enables the surface roughness of the SOI layer surface to more sufficiently reduced. The RTO process preferably forms an oxide film with a film thickness of 5 nm or more on the surface of the SOI layer.

An apparatus for rapidly heating and rapidly cooling used in the RTO process is capable of the RTA process (this apparatus is also referred to as an RTA furnace, hereinafter), and the apparatus may be, but not limited to, a lamp heater for single wafer processing, for example.

Next, the oxide film formed on the surface of the SOI layer 5 by the RTO process is removed (FIG. 1 at (C)). The removal of the oxide film facilitates the occurrence of migration of silicon atoms in the later flattening heat treatment, so that the surface roughness of the SOI layer surface can sufficiently be reduced.

The oxide film can be removed by using aqueous solution containing HF, and the like.

Next, the flattening heat treatment, which causes the migration of silicon atoms of the SOI layer surface, is performed to flatten the surface of the SOI layer (FIG. 1 at (D)).

The flattening heat treatment is not limited in particular as long as the migration occurs, and may he performed under an atmosphere of a hydrogen gas, an inert, gas, or a mixed gas thereof in an RTA furnace, or a resistance heating furnace for heat treatment. Examples of the flattening heat treatment include argon annealing in a batch type of resistance heating furnace for heat treatment (normally at temperatures of 1000° C. or more for 1 hour or more), the hydrogen RTA process in an RTA furnace, and an RTA process under an atmosphere of a mixed gas of argon and hydrogen in an RTA furnace (normally at temperatures of 1100° C. or more for a period from 10 seconds to 300 seconds). Although the description continues in the case of the argon annealing by way of example, other heat treatments capable of causing the migration can be also employed to achieve the same effects.

The film thickness of the SOI layer is then adjusted by the sacrificial oxidation process to finish. the bonded SOI wafer (FIG. 1 at (E)).

More specifically, a heat treatment is performed under an oxidizing gas atmosphere to form a thermal oxide film having a desired film thickness on the SOI wafer surface, and the thermal oxide film is then removed with an aqueous HF solution etc., to adjust the film thickness of the SOI layer.

The RTO process, which is the RTA process performed under an oxidizing atmosphere, in FIG. 1 at (B) does not have the effect of flattening due to the migration of silicon atoms of the SOI surface unlike the hydrogen RTA process. However, it is confirmed that the RTO process can instead reduce the depth of the pits, as the conventional method involving the sacrificial oxidation process right after the hydrogen PTA process does. The argon annealing performed after removing the oxide film formed by the RTO process thus allows the surface roughness to be sufficiently smoothed by the effect of the flattening due to the migration.

The present invention can improve the surface roughness with simple processes of the delamination→the RTO process→the argon annealing→the sacrificial oxidation process (for SOI film thickness adjustment) to the same degree or a higher degree that the conventional method including complicated processes of the delamination→the hydrogen RTA process→the sacrificial oxidation process→the argon annealing→the sacrificial oxidation process (for SOI film thickness adjustment) can improve the surface roughness.

The former processes (the invention) include a single step of the argon annealing to achieve the effect of flattening due to the migration, whereas the latter processes include two steps of the hydrogen RTA process and the argon annealing to achieve the effect. In consideration of this difference in number, it is a pronounced effect that the former processes (the invention) allows the surface roughness to be improved better than the latter processes, which even a person skilled in the art has never expected.

The inventors found that processes of the delamination→the RTO process→the sacrificial oxidation process (for SOI film thickness adjustment)→the argon annealing can also achieve the same effect. These processes are obtained by reversing the order between the argon annealing and the sacrificial oxidation process (for SOI film thickness adjustment) in the inventive processes of the delamination→the RTO process→the argon annealing→the sacrificial oxidation process (for SOI film thickness adjustment). In this case, the oxide film formed by the RTO process does not need to be removed because the sacrificial oxidation process (for SOI film thickness adjustment) is performed after the RTO process. The step of removing the oxide film may thus be excluded.

Figure 2:
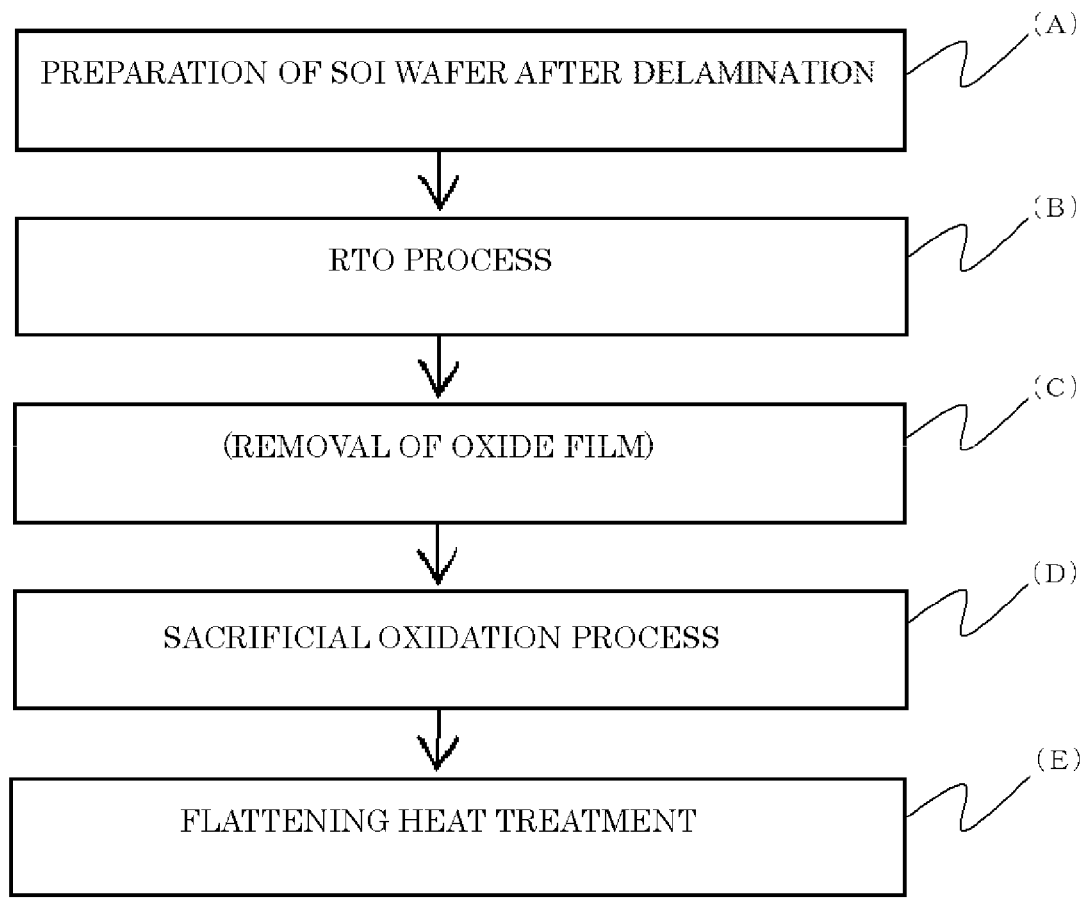
FIG. 2 illustrates a flowchart of another example of the method for manufacturing a bonded SOI wafer of the present invention.

As illustrated in FIG. 2, the present invention thus provides a method for manufacturing a bonded SOI wafer including: subjecting the bonded SOI wafer after the delamination (FIG. 2 at (A)) to the RTO process (FIG. 2 at (B)); subjecting the bonded SOI wafer to the sacrificial oxidation process to adjust the film thickness of the SOI layer after removing the oxide film, which has been formed on the SOI layer surface by the RTO process, or without removing the oxide film (FIG. 2 at (C) and (D)); then subjecting the bonded SOI wafer to the flattening heat treatment, which causes the migration of silicon atoms of the surface of the SOI layer, to flatten the SOI layer surface (FIG. 2 at (E)).

This method includes the sacrificial oxidation process, for adjusting the film thickness of the SOI layer, performed before the flattening heat treatment (the argon annealing), thereby finishing the SOI wafer as a product by the flattening heat treatment. The method may include the additional sacrificial oxidation process after the flattening heat treatment to make fine adjustment to the SOI film thickness.

EXAMPLE

The present invention will be more specifically described below with reference to examples and comparative examples, but the present invention is not limited to these examples.

Examples 1 to 12 and Comparative Examples 1 and 2

Formation of SOI Wafer (Until the Delamination Step by Mechanical Delamination)

Mirror-polished silicon single crystal wafers each having a diameter of 300 mm and a crystal orientation of <100> were prepared as the bond wafer and the base wafer. A thermal oxide film having a thickness of 150 nm was formed on the surface of the bond wafer, and hydrogen ions were implanted though the thermal oxide film under conditions of a dose amount of $6 \times 10^{16}$ cm$^2$ and an implantation energy of 50 keV. The bond wafer was then bonded to the base wafer through the oxide film at room temperature after the bonding surface of the base wafer was activated by a plasma treatment. The resultant bonded wafer was then subjected to a heat treatment, incapable of causing the delamination, at 350° C. for 1 hour, and delaminated along the ion-implanted layer by applying an external mechanical force.

Examples 13 and 14 and Comparative Examples 3 to 5

Formation of SOI Wafer (Until the Delamination Step by a Heat Treatment)

Mirror-polished silicon single crystal wafers each having a diameter of 300 mm and a crystal orientation of <100> were prepared as the bond wafer and the base wafer. A thermal oxide film having a thickness of 150 nm was formed on the surface of the bond wafer, and hydrogen ions were implanted though the thermal oxide film under conditions of a dose amount of $5 \times 10^{16}$ cm$^2$ and an implantation energy of 50 key. The bond wafer was then bonded to the surface of the base wafer through the oxide film at room temperature and delaminated by a heat treatment at 500° C. for 0.5 hour.

Each of the SOI wafers after the delamination was subjected to the following processes in the order shown in Table 1. More specifically, the order of the processes for manufacturing the bonded SOI wafer in Examples 1 to 8 and Example 13 is shown in FIG. 1 (the RTO process→the oxide film removal→the flattening heat treatment→the sacrificial oxidation process). The order or the processes for manufacturing the bonded SOI wafer in Examples 9 to 12 and Example 14 is shown in FIG. 2 (the RTO process→(the oxide film removal)→the sacrificial oxidation process→the flattening heat treatment). The order of the processes in Comparative Examples 1 to 5 is shown in Table 1.

[Evaluation of Surface Roughness]

The surfaces of the SOI layers after the completion of all the processes were observed at multiple points (within an observation area of 30 square microns) with an atom force microscope (AFM) to obtain average surface roughness (RMS and Rmax). In addition, light point defects (LPDs) of the entire surface of the SOI layer surface were measured with a laser scattering-surface inspection apparatus (SP1 made by KLA-Tencor). The measurement of the LPD was divided into measurement of LPD having a diameter of 90 nm or more and measurement of LPD having a diameter of 65 nm or more The result is given in Table 1.

The observation by the AFM is unsuitable for quantitative evaluation of the pits because the 30-sq-μm observation area is narrow and even the presence of a single pit in the area indicates a density of $1 \times 10^5$/cm$^2$. In contrast, the measurement of LPD becomes impossible if the surface roughness (RMS and Rmax) considerably varies in a plane due to the generation of pits, for example and hence a haze level of the SOI surface becomes worse, and a rougher area due to the haze is detected as a LPD. The measurement of LPD of the SOI surface accordingly enables the surface roughness of the SOI layer to be relatively compared.

In the cases where the evaluation result of LPD is 20 or less per wafer in Examples and Comparative Examples shown in Table 1, the LPDs, such as particles and surface defects, were precisely measured without being affected by the haze level of the SOI surface.

TABLE 1

| | DELAMINATION METHOD | RTO TEMPERATURE (°C.) | PERIOD (second) | ATMOSPHERE | FILM THICKNESS (nm) | OXIDE FILM REMOVAL | SACRIFICIAL OXIDATION TEMPERATURE (°C.) | FILM THICKNESS (nm) |
|---|---|---|---|---|---|---|---|---|
| EXAMPLE 1 | MECHANICAL | 1000 | 30 | 100% O2 | 5.1 | Yes | N/A | |
| EXAMPLE 2 | MECHANICAL | 1050 | 30 | 100% O2 | 7.4 | Yes | N/A | |
| EXAMPLE 3 | MECHANICAL | 1100 | 30 | 100% O2 | 9.6 | Yes | N/A | |
| EXAMPLE 4 | MECHANICAL | 1150 | 30 | 100% O2 | 14.7 | Yes | N/A | |
| EXAMPLE 5 | MECHANICAL | 1150 | 30 | wet O2 | 50.0 | Yes | N/A | |
| EXAMPLE 6 | MECHANICAL | 1200 | 30 | 100% O2 | 18.8 | Yes | N/A | |
| EXAMPLE 7 | MECHANICAL | 1200 | 30 | 100% O2 | 18.8 | Yes | N/A | |
| EXAMPLE 8 | MECHANICAL | 1200 | 30 | 100% O2 | 18.8 | Yes | N/A | |
| EXAMPLE 9 | MECHANICAL | 1200 | 30 | 100% O2 | 18.8 | Yes | 950 | 300 |
| EXAMPLE 10 | MECHANICAL | 1200 | 30 | 100% O2 | 18.8 | No | 950 | 300 |
| EXAMPLE 11 | MECHANICAL | 1200 | 30 | 100% O2 | 18.8 | Yes | 950 | 300 |
| EXAMPLE 12 | MECHANICAL | 1200 | 30 | 100% O2 | 18.8 | No | 950 | 300 |
| EXAMPLE 13 | HEAT TREATMENT | 1200 | 30 | 100% O2 | 18.8 | Yes | N/A | |
| EXAMPLE 14 | HEAT TREATMENT | 1200 | 30 | 100% O2 | 18.8 | Yes | 950 | 300 |
| COMPARATIVE EXAMPLE 1 | MECHANICAL | H2RTA(1200° C. 30 sec, 100% H2) →RTO(1200° C., 30 sec, 100% O2) →SACRIFICIAL OXIDATION (950° C., 300 nm) | | | | | | |
| COMPARATIVE EXAMPLE 2 | MECHANICAL | H2RTA(1200° C., 30 sec, 100% H2) →H2RTA(1200° C., 30 sec, 100% H2) →SACRIFICIAL OXIDATION (950° C., 300 nm) | | | | | | |
| COMPARATIVE EXAMPLE 3 | HEAT TREATMENT | H2RTA(1200° C., 30 sec, 100% H2) →FLATTENING HEAT TREATMENT (1200° C., 2 HOURS, 100% Ar) →SACRIFICIAL OXIDATION (950° C., 300 nm) | | | | | | |
| COMPARATIVE EXAMPLE 4 | HEAT TREATMENT | FLATTENING HEAT TREATMENT(1200° C., 2 HOURS, 100% Ar) →SACRIFICIAL OXIDATION (950° C., 300 nm) | | | | | | |
| COMPARATIVE EXAMPLE 5 | HEAT TREATMENT | H2RTA(1200° C., 30 sec, 100% H2) →SACRIFICIAL OXIDATION (950° C., 300 nm) →FLATTENING HEAT TREATMENT(1200° C., 2 HOURS, 100% Ar) →SACRIFICIAL OXIDATION (950° C., 100 nm) | | | | | | |

| | FLATTENING HEAT TREATMENT | | | SACRIFICIAL OXIDATION | | EVALUATION RESULT | | | |
|---|---|---|---|---|---|---|---|---|---|
| | TEMPERATURE (°C.) | PERIOD (second) | ATMOSPHERE | TEMPERATURE (°C.) | FILM THICKNESS (nm) | RMS (nm) | Rmax (nm) | LPD (≥90 nm) (number/wafer) | LPD (≥65 nm) (number/wafer) |
| EXAMPLE 1 | 1200 | 30 | 100% H2 | 950 | 300 | 0.35 | 3.6 | ≤20 | 200 |
| EXAMPLE 2 | 1200 | 30 | 100% H2 | 950 | 300 | 0.34 | 3.8 | ≤20 | 100 |
| EXAMPLE 3 | 1200 | 30 | 100% H2 | 950 | 300 | 0.32 | 3.5 | ≤20 | 30 |
| EXAMPLE 4 | 1200 | 30 | 100% H2 | 950 | 300 | 0.29 | 3.2 | ≤20 | ≤20 |
| EXAMPLE 5 | 1200 | 30 | 100% H2 | 950 | 300 | 0.28 | 3.2 | ≤20 | ≤20 |
| EXAMPLE 6 | 1200 | 30 | 100% H2 | 950 | 300 | 0.27 | 3.1 | ≤20 | ≤20 |
| EXAMPLE 7 | 1200 | 30 | 50% H2/50% Ar | 950 | 300 | 0.28 | 3.1 | ≤20 | ≤20 |
| EXAMPLE 8 | 1100 | 60 | 100% H2 | 950 | 300 | 0.33 | 3.8 | ≤20 | 30 |
| EXAMPLE 9 | 1200 | 30 | 100% H2 | N/A | | 0.28 | 3.2 | ≤20 | ≤20 |
| EXAMPLE 10 | 1200 | 30 | 100% H2 | N/A | | 0.29 | 3.1 | ≤20 | ≤20 |
| EXAMPLE 11 | 1200 | 30 | 100% H2 | 950 | 100 | 0.27 | 3.2 | ≤20 | ≤20 |
| EXAMPLE 12 | 1200 | 30 | 100% H2 | 950 | 100 | 0.28 | 3.1 | ≤20 | ≤20 |
| EXAMPLE 13 | 1200 | 2 HOURS | 100% Ar | 950 | 300 | 0.32 | 3.3 | ≤20 | ≤20 |
| EXAMPLE 14 | 1200 | 2 HOURS | 50% H2/50% Ar | 950 | 100 | 0.26 | 3.1 | ≤20 | ≤20 |
| COMPARATIVE EXAMPLE 1 | H2RTA(1200° C. 30 sec, 100% H2) →RTO(1200° C., 30 sec, 100% O2) →SACRIFICIAL OXIDATION (950° C., 300 nm) | | | | | 0.45 | 0.67 | UNABLE TO MEASURE | — |
| COMPARATIVE EXAMPLE 2 | H2RTA(1200° C., 30 sec, 100% H2) →H2RTA(1200° C., 30 sec, 100% H2) →SACRIFICIAL OXIDATION (950° C., 300 nm) | | | | | 0.33 | 6.9 | UNABLE TO MEASURE | — |
| COMPARATIVE EXAMPLE 3 | H2RTA(1200° C., 30 sec, 100% H2) →FLATTENING HEAT TREATMENT (1200° C., 2 HOURS, 100% Ar) →SACRIFICIAL OXIDATION (950° C., 300 nm) | | | | | 0.58 | 5.7 | ≥1000 | — |
| COMPARATIVE EXAMPLE 4 | FLATTENING HEAT TREATMENT(1200° C., 2 HOURS, 100% Ar) →SACRIFICIAL OXIDATION (950° C., 300 nm) | | | | | 0.54 | 5.8 | ≥2000 | — |
| COMPARATIVE EXAMPLE 5 | H2RTA(1200° C., 30 sec, 100% H2) →SACRIFICIAL OXIDATION (950° C., 300 nm) →FLATTENING HEAT TREATMENT(1200° C., 2 HOURS, 100% Ar) →SACRIFICIAL OXIDATION (950° C., 100 nm) | | | | | 0.30 | 3.2 | ≤20 | ≤20 |

The average surface roughness (RMS and Rmax) measured by the AFM hardly differed among Examples 1 to 14, and was better than that of Comparative Examples 1 to 4. The number of LPDs each having a diameter of 90 nm or more in each of Examples was 20 or less per wafer, which is excellent result. Note that the number of LPDs each having a diameter of 65 nm or more increased for the RTO process at temperatures less than 1100° C. (1000° C. or 1050° C.). The increase was resulted from the fact that the variation in surface roughness (RMS and Rmax) in a plane increased and hence rougher areas due to the haze were detected as the LPD having a diameter of 65 nm or more. Therefore, it was confirmed that the RTO process is preferably performed at temperatures of 1100° C. or more.

The processes in Comparative Example 1 are obtained, by revering the order between the ETC process and the hydrogen ETA process in the processes of Example 1. The average surface roughness (RMS and Rmax) of Comparative Example 1 was larger than that of each Example, and the surface roughness was not sufficiently reduced in Comparative Example 1. It was impracticable to measure the LED because the rougher surface roughness adversely affected the haze level.

The processes in Comparative Example 2 are obtained by replacing the RTO process with the hydrogen RTA process, which has a stronger migration effect, in the processes of Example 1. The average surface roughness (RMS and Rmax) of Comparative Example 2 was also larger than that of each Example, and the surface roughness was not sufficiently reduced in Comparative Example 2. It was impracticable to measure the LPD because the rougher surface roughness adversely affected the haze level.

The processes in Comparative Example 3 are obtained by replacing the RTO process with the hydrogen RTA process, which has a stronger migration effect, in the processes of Example 13. In Comparative Example 3, large pits were generated on the surface, the average surface roughness (RMS and Rmax) was hence larger than that of each Example, and the pits adversely affected the haze level. Since rougher areas due to the haze were detected as the LPDs, the number of LPDs (≥90 nm) became larger.

In Comparative Example 4, the flattening heat treatment was performed in a batch type heating furnace right after the delamination without the RTO process and the hydrogen RTA. In Comparative Example 4, large pits were also generated on the surface, the average surface roughness (RMS and Rmax) was hence larger than that of each Example, and the pits adversely affected the haze level. Since rougher areas due to the haze were detected as the LPDs, the number of LPDs (≥90 nm) became larger.

The processes in Comparative Example 5 are the same as the successive processes of the delamination→the hydrogen RTA process→the sacrificial oxidation process→the argon annealing→the sacrificial oxidation process (for SOI film thickness adjustment.) disclosed in Patent Document 5. Although Comparative Example 5 was achieved the same degree of surface roughness and the number of LPDs as those of each Example, Comparative Example 5 had a disadvantage that the complicated processes increased, production cost.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for manufacturing a bonded SOI wafer, comprising:
    implanting at least one gas ion selected from a hydrogen ion and a rare gas ion from a surface of a bond wafer to form an ion-implanted layer in an interior of the bond wafer, the bond wafer being composed of silicon single crystal;
    bonding the ion-implanted surface of the bond wafer to a surface of a base wafer through an insulator film; and
    delaminating a portion of the bond wafer along the ion-implanted layer to form a bonded SOI wafer having an SOI layer over the base wafer, the SOI layer being composed of a thin film of the bond wafer, wherein
    the bonded SOI wafer after the delamination is subjected to a rapid thermal oxidation process such that an oxide film is formed on a surface of the SOI layer,
    the oxide film is then removed,
    the bonded SOI wafer is then subjected to a flattening heat treatment to flatten the surface of the SOI layer, the flattening heat treatment causing migration of silicon atoms of the surface of the SOI layer, and
    the bonded SOI wafer is then subjected to a sacrificial oxidation process to adjust a film thickness of the SOI layer.

2. A method for manufacturing a bonded SOI wafer, comprising:
    implanting at least one gas ion selected from a hydrogen ion and a rare gas ion from a surface of a bond wafer to form an ion-implanted layer in an interior of the bond wafer, the bond wafer being composed of silicon single crystal;
    bonding the ion-implanted surface of the bond wafer to a surface of a base wafer through an insulator film; and
    delaminating a portion of the bond wafer along ion-implanted layer to form a bonded SOI wafer having an SOI layer over the base wafer, the SOI layer being composed of a thin film of the bond wafer, wherein
    the bonded SOI wafer after the delamination is subjected to a rapid thermal oxidation process such that an oxide film is formed on a surface of the SOI layer, the bonded SOI wafer is then subsequently subjected to a sacrificial oxidation process to adjust a film thickness of the SOI layer after removing the oxide film or without removing the oxide film, and
    the bonded SOI wafer is then subjected to a flattening heat treatment to flatten the surface of the SOI layer, the flattening heat treatment causing migration of silicon atoms of the surface of the SOI layer.

3. The method for manufacturing a bonded SOI wafer according to claim 2, wherein
    the bonded SOI wafer is subjected to an additional sacrificial oxidation process to adjust the film thickness of the SOI layer after the flattening heat treatment.

4. The method for manufacturing a bonded SOI wafer according to claim 1, wherein
    the rapid thermal oxidation process forms the oxide film with a film thickness of 5 nm or more on the surface of the SOI layer.

5. The method for manufacturing a bonded SOI wafer according to claim 2, wherein
    the rapid thermal oxidation process forms the oxide film with a film thickness of 5 nm or more on the surface of the SOI layer.

6. The method for manufacturing a bonded SOT wafer according to claim 3, wherein the rapid thermal oxidation process forms the oxide film with a film thickness of 5 nm or more on the surface of the SOI layer.

7. The method for manufacturing a bonded SOI wafer according to claim 1, wherein
the rapid thermal oxidation process is performed at 1100° C. or more for 10 seconds or more.

8. The method for manufacturing a bonded SOI wafer according to claim 2, wherein
the rapid thermal oxidation process is performed at 1100° C. or more for 10 seconds or more.

9. The method for manufacturing a bonded SOI wafer according to claim 3, wherein
the rapid thermal oxidation process is performed at 1100° C. or more for 10 seconds or more.

10. The method for manufacturing a bonded SOI wafer according to claim 4, wherein the rapid thermal oxidation process is performed at 1100° C. or more for 10 seconds or more.

11. The method for manufacturing a bonded SOI wafer according to claim 5, wherein
the rapid thermal oxidation process is performed at 1100° C. or more for 10 seconds or more.

12. The method for manufacturing a bonded SOI wafer according to claim 6, wherein
the rapid thermal oxidation process is performed at 1100° C. or more for 10 seconds or more.

13. The method for manufacturing a bonded SOI wafer according to claim 1, wherein
the flattening heat treatment is performed under an atmosphere of a hydrogen gas, an inert gas, or a mixed gas thereof.

14. The method for manufacturing a bonded SOI wafer according to claim 2, wherein
the flattening heat treatment is performed under an atmosphere of a hydrogen gas, an inert gas, or a mixed gas thereof.

15. The method for manufacturing a bonded SOI wafer according to claim 1, wherein
the flattening heat treatment is performed in a rapid thermal annealing furnace, or a resistance heating furnace for heat treatment.

16. The method for manufacturing a bonded SOI wafer according to claim 2, wherein
the flattening heat treatment is performed in a rapid thermal annealing furnace, or a resistance heating furnace for heat treatment.

* * * * *